US010899297B2

(12) United States Patent
Mori et al.

(10) Patent No.: US 10,899,297 B2
(45) Date of Patent: Jan. 26, 2021

(54) SUBMERGENCE DETECTION DEVICE, VEHICLE CONTROL DEVICE, AND VEHICLE

(71) Applicant: OMRON AUTOMOTIVE ELECTRONICS CO., LTD., Aichi (JP)

(72) Inventors: Koji Mori, Aichi (JP); Takayuki Suzuki, Aichi (JP); Yuichi Fujii, Aichi (JP); Mamoru Minamide, Aichi (JP); Hideyo Kakuno, Aichi (JP)

(73) Assignee: OMRON AUTOMOTIVE ELECTRONICS CO., LTD., Aichi (JP)

(*) Notice: Subject to any disclaimer, the term of this patent is extended or adjusted under 35 U.S.C. 154(b) by 0 days.

(21) Appl. No.: 16/533,858

(22) Filed: Aug. 7, 2019

(65) Prior Publication Data
US 2020/0047695 A1  Feb. 13, 2020

(30) Foreign Application Priority Data

Aug. 8, 2018 (JP) ................. 2018-149796

(51) Int. Cl.
| H05K 7/02 | (2006.01) |
| H05K 7/04 | (2006.01) |
| B60R 16/023 | (2006.01) |
| G01N 27/22 | (2006.01) |
| H05K 5/03 | (2006.01) |
| H05K 5/00 | (2006.01) |

(52) U.S. Cl.
CPC ....... *B60R 16/0239* (2013.01); *G01N 27/223* (2013.01); *H05K 5/0017* (2013.01); *H05K 5/03* (2013.01)

(58) Field of Classification Search
USPC .......... 361/728, 752, 796, 809, 810
See application file for complete search history.

(56) References Cited

U.S. PATENT DOCUMENTS

| 7,080,990 | B1 * | 7/2006 | Juntwait | H01R 12/724 439/79 |
| 7,140,885 | B2 * | 11/2006 | Kitamura | H05K 5/0039 439/76.1 |
| 7,686,623 | B2 * | 3/2010 | Honda | H05K 5/0039 439/78 |
| 9,781,849 | B2 * | 10/2017 | Negishi | H05K 5/0056 |
| 2012/0103808 | A1 * | 5/2012 | Igarashi | G01N 27/4071 204/424 |

FOREIGN PATENT DOCUMENTS

| JP | 2012-109629 A | 6/2012 | |
| JP | 2015115148 | * 12/2013 | ............. H01R 13/64 |
| JP | 2017-108000 A | 6/2017 | |

* cited by examiner

*Primary Examiner* — Hung S. Bui
(74) *Attorney, Agent, or Firm* — Osha Bergman Watanabe & Burton LLP (57) ABSTRACT

A submergence detection device includes: a housing in which an opening is formed; and a detection electrode disposed inside the housing and configured to detect a submergence. A through hole is formed in the housing. When seen from the opening, a wall surface that is located in the housing farther than a position of the through hole is watertight. When seen from the opening, the detection electrode is disposed closer to the opening than the through hole.

9 Claims, 5 Drawing Sheets

SUBMERGENCE DETECTION DEVICE, VEHICLE CONTROL DEVICE, AND VEHICLE

CROSS-REFERENCES TO RELATED APPLICATIONS

This application is based upon and claims the benefit of priority from Japanese Patent Application No. 2018-149796, filed on Aug. 8, 2018; the entire contents of which are incorporated herein by reference.

FIELD

The present invention relates to a submergence detection device, a vehicle control device, and a vehicle.

BACKGROUND

Generally, an electronic control unit (ECU), which is an on-board control device of a vehicle, employs a waterproof structure to prevent water from entering the electronic control unit. For example, JP-A-2012-109629 discloses an invention in which in electronic equipment with a housing, water droplets falling from above onto an upper surface (top plate) of the housing, or moisture accumulated on the upper surface is prevented from entering the housing of the equipment. JP-A-2017-108000 discloses an invention in which it is possible to waterproof a circuit board accommodated inside a case of an electronic device.

A power window control device installed in a vehicle requires a function to detect a submergence state for the purpose of securing an evacuation path for an occupant getting in the vehicle when the vehicle is submerged. In many cases, the control device is installed in the vehicle, separately from the ECU.

In recent years, the integration of power window control with other control has increased, and for example, power window control and door mirror control may be integrated together, and may be controlled by one control device.

An object of the control devices provided in the related art is to prevent water from entering the control devices during normal operation. For this reason, when the vehicle is submerged, such control devices may not be capable of detecting the submergence, and controlling power windows to be openable even after the submergence.

SUMMARY

An object of one embodiment of the present invention is to provide a submergence detection device which, when a submergence occurs, during normal operation, accurately detects a submergence state without a false detection induced by water droplets on the outside.

According to one aspect of the present invention, a submergence detection device includes a housing in which an opening is formed; and a detection electrode disposed inside the housing and configured to detect a submergence, in which a through hole is formed in the housing, in which when seen from the opening, a wall surface that is located in the housing farther than a position of the through hole is watertight, and in which when seen from the opening, the detection electrode is disposed closer to the opening than the through hole.

According to one aspect of the present invention, when a submergence occurs, during normal operation, it is possible to accurately detect a submergence state without a false detection induced by water droplets on the outside.

DETAILED DESCRIPTION

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Embodiment 1

Hereinafter, an embodiment of the present invention will be described with reference to the drawings. In the embodiment, an electronic control unit (ECU), which is an on-board control device (vehicle control device) of a vehicle, will be described as an example of a control device.

Figure 1:
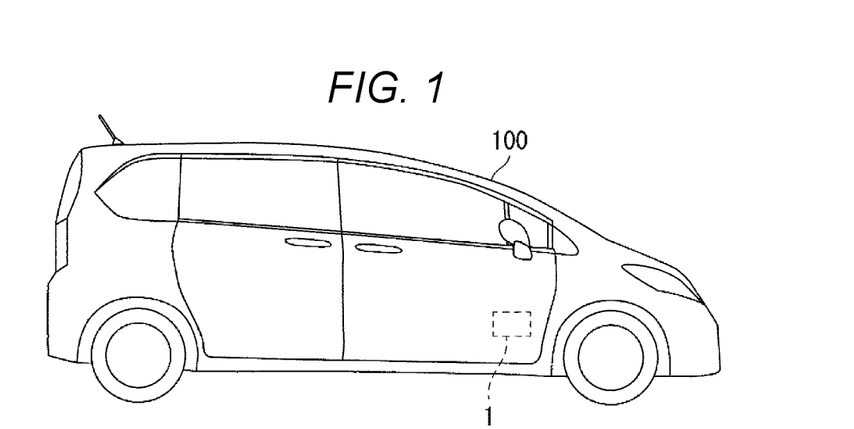
FIG. 1 is a side view illustrating a configuration of a vehicle in one embodiment of the present invention.

FIG. 1 is a side view illustrating a configuration of a vehicle in the embodiment. A vehicle 100 includes an ECU 1 (control device and submergence detection device). The ECU 1 controls the opening and closing of power windows and the opening and closing of door mirrors.

Figure 2:
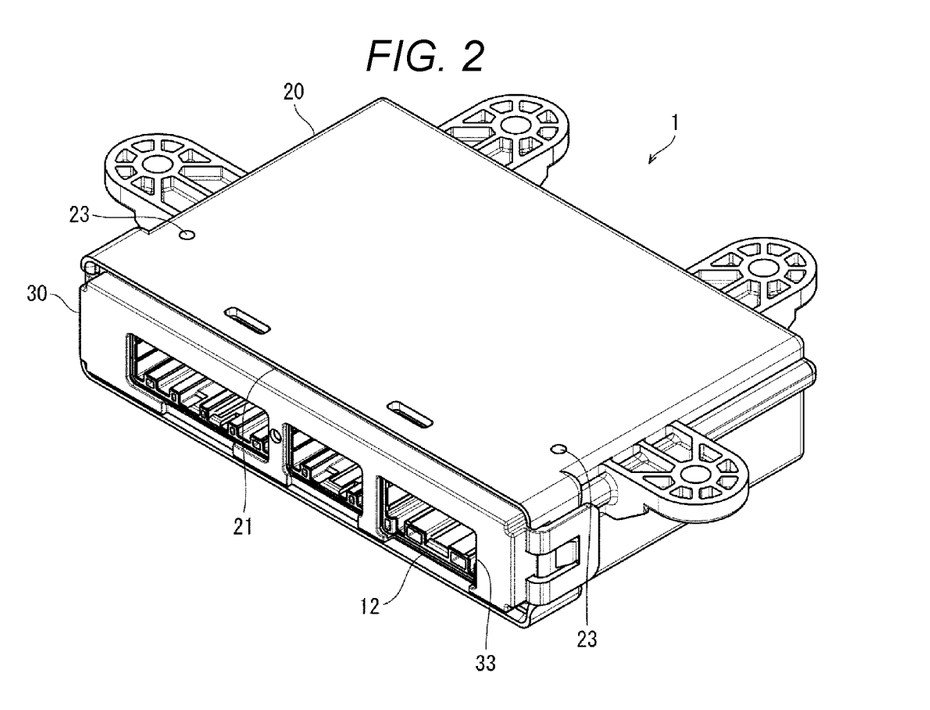
FIG. 2 is a perspective view illustrating a configuration of an ECU in the embodiment of the present invention.
Figure 3:
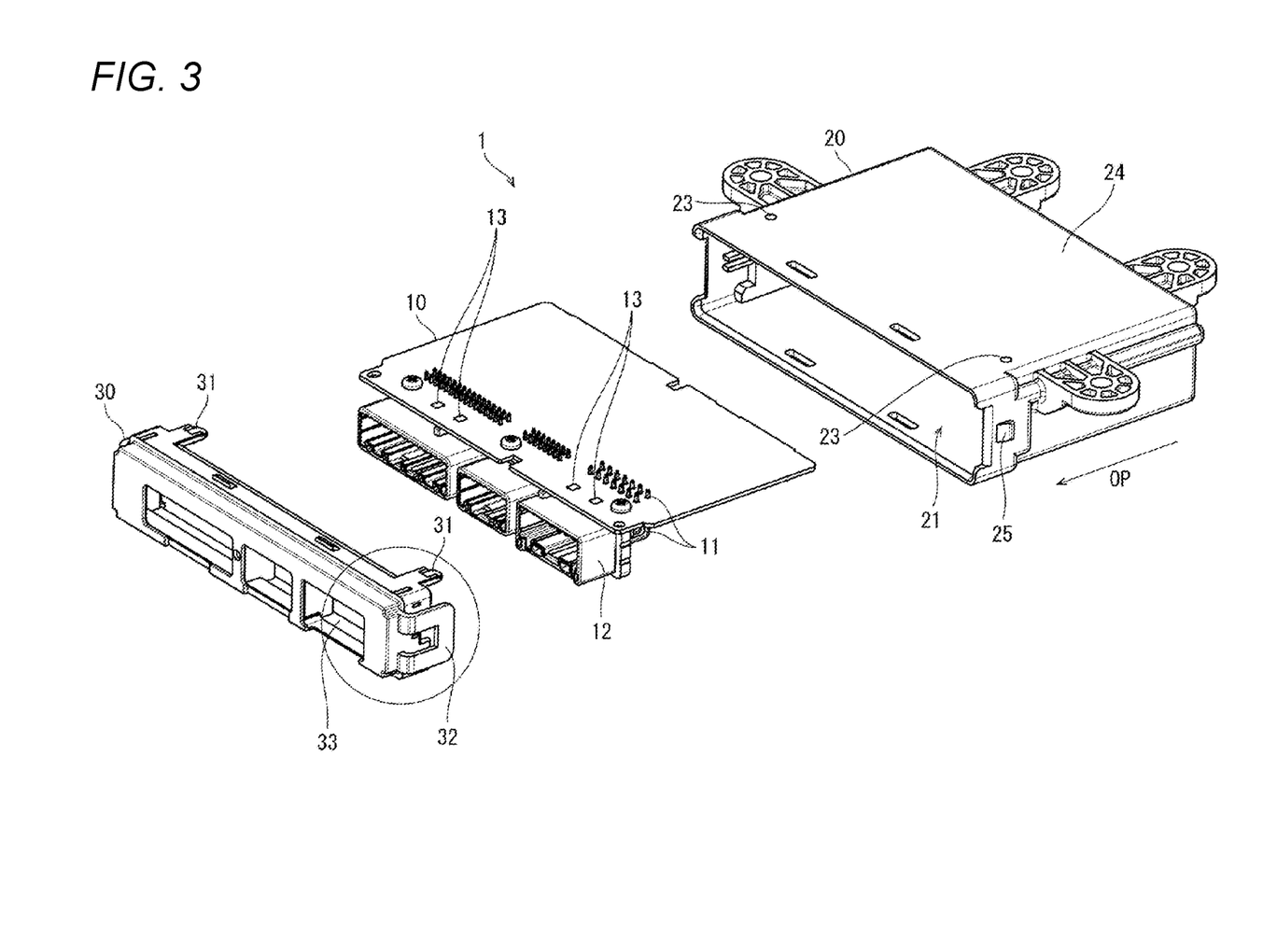
FIG. 3 is an exploded perspective view illustrating the configuration of the ECU in the embodiment of the present invention.

FIG. 2 is a perspective view illustrating a configuration of the ECU in the embodiment. FIG. 3 is an exploded perspective view illustrating the configuration of the ECU in the embodiment.

As illustrated in FIG. 3, the ECU 1 includes a circuit board 10; a connector 12; a housing 20; and a lid 30.

The circuit board 10 has a size so that the circuit board 10 can be accommodated in the housing 20. The circuit board 10 is a rectangular printed board. A detection circuit 14 and a control circuit 15 are mounted on one surface of the circuit board 10 (refer to FIGS. 4A and 4B). Four detection electrodes 13 are formed on the other surface of the circuit board 10. A plurality of wirings (not illustrated) are formed on the circuit board 10, and the detection circuit 14, the control circuit 15, and four detection electrodes 13 are connected to each other via the plurality of wirings.

The connector 12 is a member for connecting external cables to the ECU 1. The connector 12 is fixed to the circuit board 10. The connector 12 and the circuit board 10 are connected to each other via a plurality of L-shaped connector pins 11. The ECU 1 is connected to external on-board devices (power window drive device and door mirror drive device) and other external control devices via cables.

The housing 20 has a rectangular parallelepiped shape. An opening 21 is formed in the housing 20, and opens in a predetermined direction OP. Two through holes 23 functioning as air holes are formed in a wall 24 forming part of the housing 20. The housing 20 has a wall surface (including a wall surface facing the opening 21) watertight and located closer to a depth side than (i.e., farther than) two through holes 23, when seen from the opening 21. The housing 20 has a second projected engaging portion 25 in each of two side surfaces. The circuit board 10 and the connector 12 are inserted into the housing 20 via the opening 21.

The lid 30 includes two front walls 31; two first engaging portions 32; and a terminal opening 33. Two front walls 31 extend to the inside of the housing 20 from positions slightly inward from both ends of the lid 30. Two first engaging portions 32 are provided at both ends of the lid 30, respectively. The terminal opening 33 is a hole for exposing the connector 12.

Part of the lid 30 including two front walls 31 is inserted into the housing 20 via the opening 21 of the housing 20. The first engaging portions 32 provided in the lid 30 are engaged with and fixed to the second projected engaging portions 25 provided in the housing 20 in a state where the circuit board 10, the connector 12, and part of the lid 30 are accommodated inside the housing 20. Therefore, the lid 30 blocks the opening 21 of the housing 20. The connector 12 is exposed to the outside from the terminal opening 33.

Two through holes 23 are provided in the wall 24 to allow air inside the housing 20 to escape to the outside. Two through holes 23 are connected to a space in which the detection electrodes 13 are disposed.

Figure 4A:
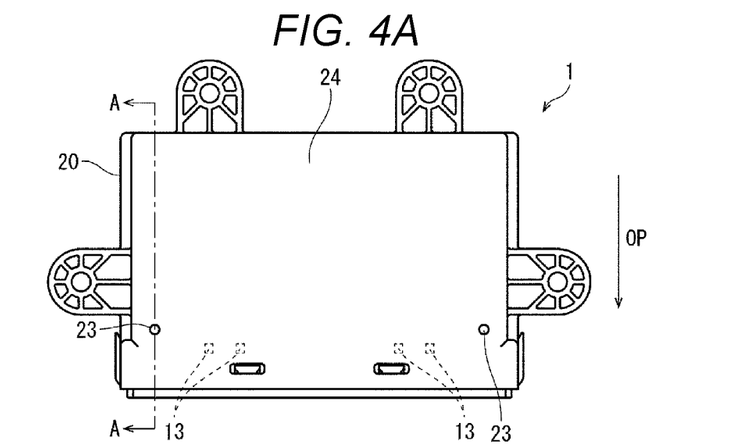
FIG. 4A is a front view of the ECU.
Figure 4B:
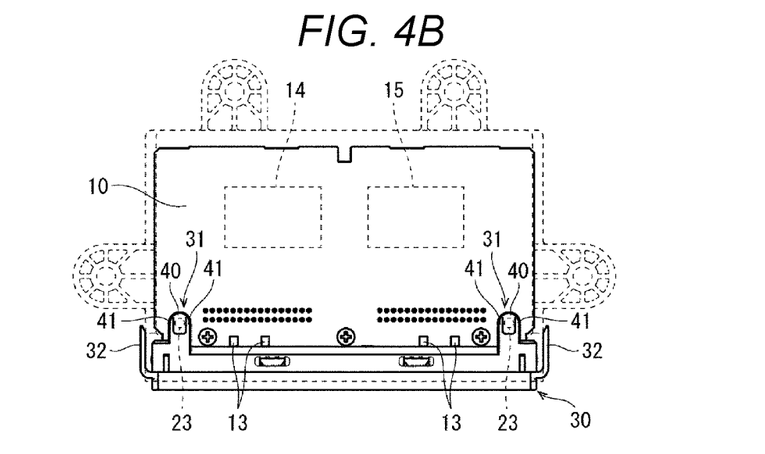
FIG. 4B is a front view illustrating a circuit board inside a housing.

FIGS. 4A are 4B are front views illustrating the configuration of the ECU in the embodiment. FIG. 4A is a front view of the ECU. FIG. 4B is a front view illustrating the circuit board inside the housing illustrated by the dotted line. In FIG. 4A, the positions of the plurality of detection electrodes 13 are illustrated by the dotted lines. In FIG. 4B, the positions of the plurality of through holes 23, the detection circuit 14, and the control circuit 15 are illustrated by the dotted lines.

The plurality of detection electrodes 13 are disposed closer to the opening 21 in the predetermined direction OP than the plurality of through holes 23. That is, when seen from the opening 21, the plurality of detection electrodes 13 are disposed closer to the opening 21 than the plurality of through holes 23. The plurality of detection electrodes 13 are exposed inside the housing 20. The detection circuit 14 detecting a submergence, and the control circuit 15 are disposed across the plurality of through holes 23 from the opening 21. That is, when seen from the opening 21, the detection circuit 14 and the control circuit 15 are disposed closer to the depth side than (i.e., farther than) the plurality of through holes 23.

Four detection electrodes 13 are electrodes for detecting whether the ECU 1 is in a submergence state. If at least two of four detection electrodes 13 are submerged, two detection electrodes 13 are electrically connected (shorted) together. If the detection circuit 14 detects that two detection electrodes 13 are electrically connected together, the detection circuit 14 detects that the ECU 1 is submerged. In order to control the opening and closing of the power windows and the opening and closing of the door mirrors, the control circuit 15 controls the power window drive device and the door mirror drive device installed in the vehicle 100.

Figure 5A:
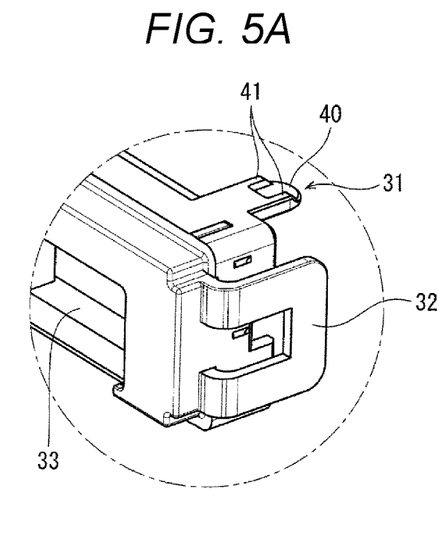
FIG. 5A is an enlarged perspective view illustrating a partial configuration of a lid illustrated in FIG. 3.
Figure 5B:
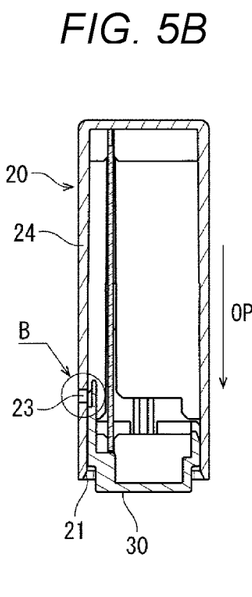
FIG. 5B is a cross-sectional view taken along cutting line A-A in FIG. 4A.
Figure 5C:
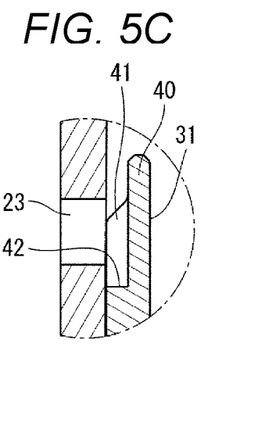
FIG. 5C is an enlarged cross-sectional view of a through hole and a front wall.

FIG. 5A is an enlarged perspective view illustrating a partial configuration of the lid illustrated in FIG. 3. FIG. 5B is a cross-sectional view taken along cutting line A-A in FIG. 4A. FIG. 5C is an enlarged cross-sectional view of the through hole and the front wall.

The front wall 31 has a recessed tip. Specifically, the front wall 31 includes a first wall 40; and two second walls 41 that extend from both end portions of the first wall 40 to an inner surface (inner wall) of the wall 24 of the housing 20. Two second walls 41 face each other. An outlet of the through hole 23 is positioned between two second walls 41 inside the housing 20. In other words, two second walls 41 are disposed such that the position of the outlet of the through hole is interposed therebetween in a lateral direction (direction parallel with the inner surface of the wall 24, and perpendicular to the predetermined direction OP). The front wall 31 further includes a third wall 42 extending from the first wall 40 to the inner surface of the wall 24 of the housing 20. The third wall 42 connects together two second walls. The third wall 42 is positioned closer to the opening 21 (the outside in the predetermined direction OP) than two second walls 41.

The front wall 31 is accommodated inside the housing 20 and is positioned in front of the through hole 23 of the housing 20 in a state where the lid 30 is attached to the housing 20. Specifically, the first wall 40 is positioned in front of the through hole 23. When seen from the opening 21, the first wall 40 further extends to the depth side (which is opposite to the outside in the predetermined direction OP) than the through hole 23. Two second walls 41 and the third wall 42 are in contact with the inner surface (inner wall) of the wall 24 such that the outlet of the through hole 23 is surrounded by the third wall 42 on three sides inside the housing 20 when seen from a direction perpendicular to the inner surface of the wall 24. The first wall 40, two second walls 41, and the third wall 42 form a water receiver that receives water entering via the through hole 23. The ECU 1 has a clearance between the front wall 31 and the wall 24, and the clearance is closer to one side (which is opposite to the opening 21) inside the housing 20 than the position of the through hole 23. Air inside the housing 20 is capable of passing through the clearance, and escaping via the through hole 23.

The ECU 1 is installed in the vehicle 100 such that the opening 21 faces downward (the predetermined direction OP becomes a downward direction). In other words, the ECU 1 is disposed such that the plurality of detection electrodes 13 are located below the plurality of through holes 23.

Water droplets is capable of entering through the periphery of the ECU 1 inside the vehicle 100 due to rains or condensation. Because part of the housing 20, located upward from the through holes 23, is watertight, the housing 20 is capable of preventing the water droplets from getting onto the detection electrodes 13, the detection circuit 14, or the control circuit 15. Water droplets move along the outside of the housing 20, or directly get into the through holes 23, and thus are capable of entering the housing 20 via the through holes 23. The first wall 40 of the front wall 31 receives water entering via the through hole 23.

As described above, because the first wall 40 stops water that has entered via the through holes 23, the entering water does not get onto the detection electrodes 13, the detection circuit 14, or the control circuit 15, which is provided inside the housing. The second walls 41 are provided at the right and left (on both sides) of the first wall 40, respectively. Accordingly, after the first wall 40 receives water that has entered via the through holes 23, the second walls 41 receives water flowing rightward and leftward. The third wall 42 receives water flowing downward. The water, which has entered via the through holes 23, is received by the water receiver formed by the first wall 40, two second walls 41, and the third wall 42. The received water is gradually discharged outside the housing 20 via the through holes 23 again, or a small clearance between the wall 24 and the lid 30.

For this reason, during normal operation, water droplets entering through the periphery of the ECU 1 does not reach the detection electrodes 13, the detection circuit 14, or the control circuit 15. Accordingly, the ECU 1 avoids a false detection of a submergence state, which is based on water droplets existing outside the housing 20 during normal operation.

If the vehicle 100 is submerged, the ECU 1 is also submerged. Waterproofing is not applied between the opening 21 of the housing 20 and the lid 30, and there is a clearance that allows water to enter therethrough. If the housing 20 is not provided with the through holes 23, because air inside the housing 20 is not capable of escaping to the outside, water is prevented from entering via the opening 21, and it is not possible to detect a submergence state. In the ECU 1 of the embodiment, air inside the housing 20 escapes via the through holes 23, and thus water enters the housing 20 via the clearance between the opening 21 of the housing 20 and the lid 30, or via the terminal opening 33. Water enters and reaches approximately the height of the through holes 23. Therefore, the plurality of detection electrodes 13 are submerged. The detection circuit 14 for detecting a submergence, and the control circuit 15 for performing control are not submerged because being positioned upward from the through holes 23. If the ECU 1 is in a submergence state, the detection circuit 14 is capable of detecting that two detection electrodes 13 are electrically connected together, and accurately detecting the submergence state. The detection circuit 14, which has detected the submergence state, outputs a signal, indicating the submergence state, to the control circuit 15.

The control circuit 15, which has received the signal indicating the submergence state, performs controls (controls different from those during normal operation) for a submergence. The control circuit 15 switches a power acquisition path from a path, through which power is acquired via other control devices (microcomputer and the like), to a path through which power is acquired directly from a power supply. The reason for switching is that if other control devices are submerged and fail, power may not be capable of being acquired via other control devices. In addition, the control circuit 15 controls the power window drive device so that only an opening operation of opening and closing operations of the power windows is enabled. Therefore, it is possible to secure an evacuation path for an occupant getting in the vehicle 100. In addition, the detection circuit 14 transmits a signal, which indicates the submergence state, to other control devices (not illustrated) that control other electrical equipment. Other control devices, which have received the signal, shut off power being supplied thereto. Therefore, it is possible to prevent failures of other control devices, which are induced by short circuits.

Embodiment 2

In an embodiment, the shape of a front wall is different from that in Embodiment 1. For descriptive purposes, the same reference signs will be assigned to members having the same functions as those of the members described above in the embodiment, and descriptions of the members with the same reference signs will not be repeated.

Figure 6A:
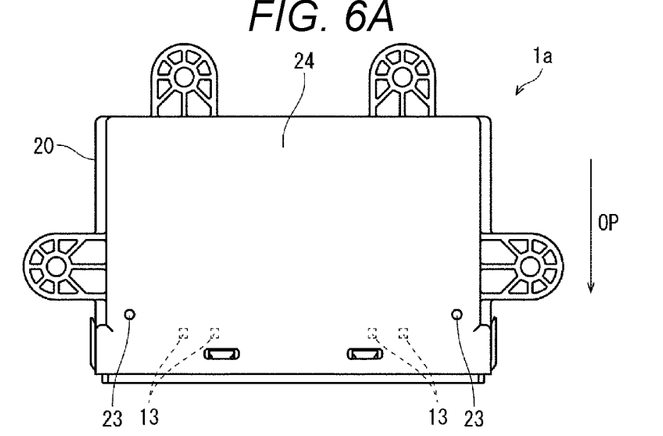
FIG. 6A is a front view illustrating a configuration of an ECU in an embodiment of the present invention.
Figure 6B:
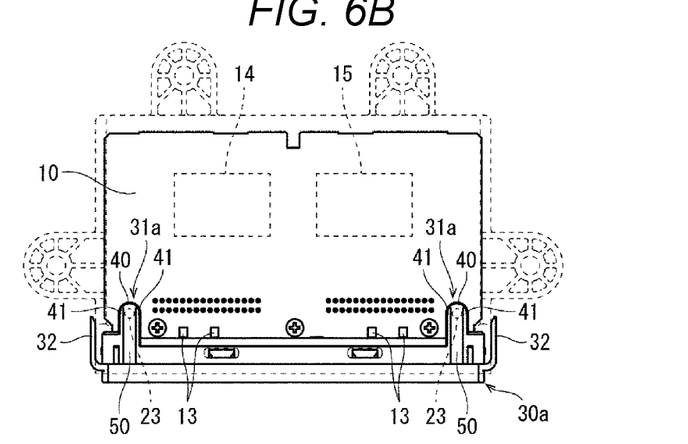
FIG. 6B is a front view illustrating a circuit board inside a housing.
Figure 6C:
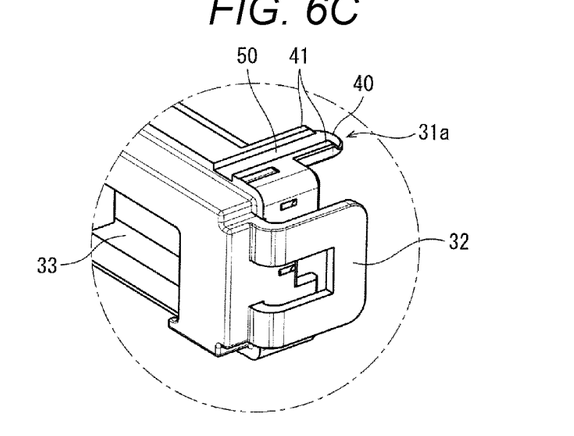
FIG. 6C is an enlarged perspective view illustrating a partial configuration of a lid.

FIG. 6A is a front view illustrating a configuration of an ECU in the embodiment. FIG. 6B is a front view illustrating a circuit board inside a housing illustrated by the dotted line. FIG. 6C is an enlarged perspective view illustrating a partial configuration of a lid. In FIG. 6A, the positions of the plurality of detection electrodes 13 are illustrated by the dotted lines. In FIG. 6B, the positions of the plurality of through holes 23, the detection circuit 14, and the control circuit 15 are illustrated by the dotted lines.

An ECU 1a of the embodiment includes the circuit board 10; the connector 12 (not illustrated); the housing 20; and a lid 30a.

The lid 30a includes two front walls 31a extending to the inside of the housing 20. The front wall 31a does not have the third wall that receives water flowing downward (to the opening). The front wall 31a includes the first wall 40; and two second walls 41 that are formed on both sides of the first wall 40. Therefore, the front wall 31a forms a water guide path 50 that continues from the through hole 23 to the opening of the housing 20. Except the water guide path 50, the front wall 31a is the same as that described above in the embodiment, and thus a description thereof will be omitted.

The first wall 40 and two second walls 41 receive water which has entered via the through hole 23 provided in the housing 20. Because the ECU 1a is disposed such that the opening faces downward (the predetermined direction OP becomes a downward direction), the water guide path 50 guides the entering water to the opening, and discharges the entering water. Two second walls 41 are in contact with an inner wall of the housing 20. A space surrounded by the first wall 40, two second walls 41, and the inner wall of the housing 20 becomes the water guide path 50.

In the configuration, even though water droplets enter the housing 20 via the through holes 23 provided in the housing 20, the ECU 1a is capable of discharging water outside the housing 20 via the water guide path 50 without storing water received by the front wall 31a.

Therefore, an allowance of water being received by the front wall 31a becomes greater than an allowance of water received by the front wall 31 in Embodiment 1, and thus it is possible to effectively avoid water coming into contact with the detection electrodes 13 provided in the circuit board 10, and to prevent a submergence state from being falsely detected.

Modification Example

In the embodiments, each of the ECUs 1 and 1a includes four detection electrodes 13. For example, even though the ECUs 1 and 1a are obliquely attached to the vehicle 100 (the opening 21 faces obliquely downward), if any two of the detection electrodes 13 are positioned below one of the through holes 23, the ECUs 1 and 1a are capable of properly detecting a submergence state. If three or more detection electrodes 13 or the plurality of through holes 23 are provided, it is possible to increase the allowable angle of attachment of the ECUs 1 and 1a to the vehicle 100 while satisfying the condition that any two of the detection electrodes 13 are positioned below any one of the through holes 23. If at least two of the detection electrodes 13 are disposed such that at least two detection electrodes 13 are interposed between two through holes 23 (refer to FIGS. 4A and 4B), the ECUs 1 and 1a can be configured such that any one of the through holes 23 is positioned upward from two detection electrodes 13 even though the ECUs 1 and 1a are inclined. Therefore, when the ECUs 1 and 1*a* are submerged, even though the vehicle 100 is inclined, two detection electrodes 13 can be submerged.

The ECUs 1 and 1*a* may have a configuration in which two detection electrodes 13 are provided, or may have a configuration in which three or more detection electrodes 13 are provided. If the detection circuit 14 detects a submergence state using a capacitance of the detection electrode 13 or the like instead of a short circuit, the ECUs 1 and 1*a* may have a configuration in which one or more detection electrodes 13 are provided.

The number of the through holes 23 formed in the housing 20 may be one, or two or more. One or more front walls 31 may be provided corresponding to the number of the through holes 23.

In Embodiment 1, the third wall 42 of the front wall 31 is positioned below (closer to the opening 21) a lower end (end closer to the opening 21) of the through hole 23 provided in the housing 20. For this reason, for example, even though the position of the third wall 42 is offset due to assembly tolerances of the lid 30 and the housing 20, the third wall 42 does not overlap the through hole 23. Accordingly, there is no change in the effective cross-sectional area of the through hole 23 functioning as an air hole. For this reason, the ECU 1 can become consistent in performance. The third wall 42 and the lower end of the through hole 23 may be located at the same height (position). Alternatively, the third wall 42 may be positioned upward (opposite to the opening 21) from the lower end of the through hole 23.

In the embodiments, the front walls 31 and 31*a* are formed in the lid 30; however, the front walls 31 and 31*a* may be formed in the housing 20 instead of in the lid 30. At least one terminal opening 33 may be formed in the lid 30, or the number of the terminal openings 33 may be two, or three or more.

The front wall 31 (the first wall 40, the second wall 41, and the third wall 42) may have curved wall surfaces. Two second walls 41 and/or the third wall 42 may be omitted. For example, the front wall 31 may have a semi-cylindrical shape. In order to prevent water from getting onto the plurality of detection electrodes 13 inside the housing 20, the front wall 31 stops the power of water entering via the through hole 23.

The front wall 31 may be omitted. When the ECU 1 is submerged, because air escapes via the through holes 23, the plurality of detection electrodes 13 become submerged. For this reason, the detection circuit 14 is capable of accurately detecting a submergence state. Water droplets on the outside are prevented by the housing 20 covering the plurality of detection electrodes 13 from above. If the plurality of detection electrodes are disposed apart from the wall 24 of the housing 20, in which the through holes 23 are formed, unless water droplets powerfully enter via the through holes 23, the detection circuit 14 does not falsely detect a submergence state.

In the embodiments, the detection circuit 14 and the control circuit 15 are sealed and waterproof. The detection circuit 14 and the control circuit 15 may be disposed below (closer to the opening 21) the plurality of through holes 23. If the detection circuit 14 and the control circuit 15 are disposed upward (opposite to the opening 21) from the plurality of through holes 23, the detection circuit 14 and/or the control circuit 15 may not be waterproof. In this case, the wall surface, located closer to the depth side in the housing 20 than the positions of the through holes 23, preferably is airtight. If the detection circuit 14 and the control circuit 15 are waterproof, and are disposed upward from the plurality of through holes 23, it is possible to further reduce the probability of failure induced by a submergence. Accordingly, when a submergence occurs, the detection circuit 14 and the control circuit 15 are capable of more reliably operating.

The detection circuit 14 and the control circuit 15 may be formed of integrated circuits, or may be formed of a plurality of circuit elements (resistors, capacitors, transistors, and/or diodes). The control circuit 15 is not limited to controlling the power window control device, and may control arbitrary on-board devices in response to the result of detection of a submergence.

In the example described above, the present invention is applied to an ECU as a control device of a vehicle; however, the present invention is not limited to an ECU of a vehicle, and in an embodiment of the present invention, a submergence detection device detecting a submergence is applicable. For example, the control circuit 15 may be provided in a control device separate from a submergence detection device. The submergence detection device includes a circuit board (not including the control circuit 15); a housing; and a lid. A detection circuit provided in the submergence detection device transmits a signal, which indicates that a submergence is detected, to the other control device.

Summary

According to a first aspect of the present invention, a submergence detection device includes a housing in which an opening is formed; and a detection electrode disposed inside the housing and configured to detect a submergence, in which a through hole is formed in the housing, in which when seen from the opening, a wall surface that is located in the housing farther than a position of the through hole is watertight, and in which when seen from the opening, the detection electrode is disposed closer to the opening than the through hole.

According to the configuration, because the wall surface that is located in the housing farther from the opening than the position of the through hole is watertight, it is possible to prevent water droplets on the outside from getting onto the detection electrode during normal operation. Because the submergence detection device is disposed such that the opening is positioned on the lower side of the housing, when the submergence detection device is submerged, water enters the housing to reach the position of the through hole. Because the detection electrode is disposed closer to the opening than the through hole, when a submergence occurs, it is possible to accurately detect a submergence state by reliably enabling the detection electrode to be submerged.

According to a second aspect of the present invention, the submergence detection device of the first aspect may further include a front wall disposed inside the housing and in front of the through hole.

According to the configuration, during normal operation, water entering the housing via the through hole can be prevented from getting onto the detection electrode. Accordingly, when a submergence occurs, during normal operation, it is possible to accurately detect a submergence state without a false detection induced by water droplets on the outside.

According to a third aspect of the present invention, the submergence detection device of the second aspect may further include a lid disposed in the opening of the housing, in which part of the lid forms the front wall.

From manufacturing standpoint, it may be difficult to form the front wall, integrated with the housing, inside the housing. According to the configuration, it is possible to form the front wall integrated with the lid, and to easily dispose the front wall in front of the through hole.

According to a fourth aspect of the present invention, in the submergence detection device of the second or third aspect, the front wall may include: a first wall positioned in front of the through hole; and two second walls extending from the first wall to an inner wall of the housing such that the through hole is interposed between two second walls.

According to the configuration, water entering the housing via the through hole can be prevented from being splashed in a lateral direction by two second walls disposed such that the through hole is interposed therebetween. According to the configuration, during normal operation, water entering the housing via the through hole can be prevented from getting onto the detection electrode.

According to a fifth aspect of the present invention, in the submergence detection device of the second or third aspect, the front wall may be in contact with the inner wall such that the through hole is surrounded by the front wall on three sides on the inner wall of the housing, and may have a clearance between the front wall and the inner wall on one side of the through hole.

According to the configuration, during normal operation, the front wall retains water entering the housing via the through hole, and thus the water entering the housing via the through hole can be prevented from getting onto the detection electrode.

According to a sixth aspect of the present invention, in the submergence detection device of the fourth aspect, the front wall may form a water guide path continuing from the through hole to the opening.

According to the configuration, during normal operation, water entering the housing can be discharged outside the housing via the water guide path.

According to a seventh aspect of the present invention, the submergence detection device of any one of the first to sixth aspects may further include a detection circuit disposed inside the housing and configured to detect whether the detection electrode is in a submergence state, in which when seen from the opening, the detection circuit may be disposed farther than the position of the through hole.

According to the configuration, even though a submergence occurs, because the detection circuit is not submerged, it is possible to reduce the probability of failure of the detection circuit.

According to an eighth aspect of the present invention, a vehicle control device may include the submergence detection device of any one of the first to seventh aspects; and a control circuit configured to control an on-board device in response to a detection result of the submergence detection device.

According to a ninth aspect of the present invention, a vehicle may include the vehicle control device of the eighth aspect, in which the vehicle control device may be disposed such that the detection electrode is located below the through hole.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A submergence detection device comprising:
   a housing in which an opening is formed; and
   a detection electrode disposed inside the housing and configured to detect a submergence,
   wherein a through hole is formed in the housing,
   wherein when seen from the opening, a wall surface that is located in the housing farther than a position of the through hole is watertight, and
   wherein when seen from the opening, the detection electrode is disposed closer to the opening than the through hole.

2. The submergence detection device according to claim 1, further comprising:
   a front wall disposed inside the housing and in front of the through hole.

3. The submergence detection device according to claim 2, further comprising:
   a lid disposed in the opening of the housing,
   wherein part of the lid forms the front wall.

4. The submergence detection device according to claim 2,
   wherein the front wall comprises:
   a first wall positioned in front of the through hole; and
   two second walls extending from the first wall to an inner wall of the housing, and facing each other.

5. The submergence detection device according to claim 4,
   wherein the front wall further comprises a third wall extending from the first wall to the inner wall of the housing, and connecting together the two second walls, and
   wherein the first wall, the two second walls, and the third wall form a water receiver that receives water entering via the through hole.

6. The submergence detection device according to claim 2,
   wherein the front wall forms a water guide path continuing from the through hole to the opening.

7. The submergence detection device according to claim 1, further comprising:
   a detection circuit disposed inside the housing and configured to detect whether the detection electrode is in a submergence state,
   wherein when seen from the opening, the detection circuit is disposed farther than the position of the through hole.

8. A vehicle control device comprising:
   the submergence detection device according to claim 1; and
   a control circuit configured to control an on-board device in response to a detection result of the submergence detection device.

9. A vehicle comprising:
   the vehicle control device according to claim 8,
   wherein the vehicle control device is disposed such that the detection electrode is located below the through hole.

* * * * *